United States Patent
Rohleder et al.

(10) Patent No.: US 8,812,931 B2
(45) Date of Patent: Aug. 19, 2014

(54) MEMORY SYSTEM WITH ECC-UNIT AND FURTHER PROCESSING ARRANGEMENT

(75) Inventors: Michael Rohleder, Unterschleissheim (DE); Davor Bogavac, Kallered (SE)

(73) Assignee: Freescale Semiconductor, Inc., Austin, TX (US)

( * ) Notice: Subject to any disclaimer, the term of this patent is extended or adjusted under 35 U.S.C. 154(b) by 1052 days.

(21) Appl. No.: 12/515,242

(22) PCT Filed: Nov. 21, 2006

(86) PCT No.: PCT/EP2006/068715
§ 371 (c)(1),
(2), (4) Date: May 15, 2009

(87) PCT Pub. No.: WO2008/061558
PCT Pub. Date: May 29, 2008

(65) Prior Publication Data
US 2010/0058144 A1    Mar. 4, 2010

(51) Int. Cl.
*H03M 13/00*    (2006.01)
*G11C 29/00*    (2006.01)
*G06F 11/10*    (2006.01)
*H03M 13/15*    (2006.01)

(52) U.S. Cl.
CPC ......... *G06F 11/1008* (2013.01); *H03M 13/151* (2013.01); *G06F 11/1016* (2013.01)
USPC .......................................... 714/759; 714/773

(58) Field of Classification Search
CPC ........... G06F 11/1008; G06F 11/1016; H03M 13/151
USPC .................................................. 714/759, 773
See application file for complete search history.

(56) References Cited

U.S. PATENT DOCUMENTS

| | | | | |
|---|---|---|---|---|
| 4,058,851 A * | 11/1977 | Scheuneman | ................... | 714/6.2 |
| 4,107,650 A * | 8/1978 | Luke et al. | ..................... | 714/762 |
| 4,112,502 A * | 9/1978 | Scheuneman | ................... | 714/5.1 |
| 4,209,846 A | 6/1980 | Seppa | | |
| 4,335,459 A | 6/1982 | Miller | | |
| 4,380,066 A * | 4/1983 | Spencer et al. | ................ | 714/6.1 |
| 4,414,665 A * | 11/1983 | Kimura et al. | ................ | 714/719 |
| 4,577,319 A * | 3/1986 | Takeuchi et al. | .............. | 714/765 |
| 4,592,024 A * | 5/1986 | Sakai et al. | .................... | 365/200 |
| 4,608,687 A * | 8/1986 | Dutton | ........................... | 714/710 |
| 4,654,847 A * | 3/1987 | Dutton | ........................... | 714/6.1 |
| 4,688,219 A * | 8/1987 | Takemae | ....................... | 714/711 |
| 4,782,487 A * | 11/1988 | Smelser | ........................ | 714/723 |

(Continued)

FOREIGN PATENT DOCUMENTS

| EP | 0139124 | 5/1985 |
|---|---|---|
| GB | 2313217 A | 11/1997 |

OTHER PUBLICATIONS

PCT Application No. PCT/EP2006/068715: Search Report and Written Opinion mailed Sep. 24, 2007.

*Primary Examiner* — Joseph D Torres

(57) ABSTRACT

A memory system including a first memory for storing data and an ECC unit for accessing the first memory and for detecting errors in data retrieved from the first memory, and characterised by an error further processing arrangement operable to process errors detected by the ECC unit, the error further processing arrangement including a second memory for recording information relating to the detected errors. Also described is a method of operation in the memory system.

12 Claims, 1 Drawing Sheet

(56) References Cited

U.S. PATENT DOCUMENTS

| | | | | |
|---|---|---|---|---|
| 4,905,242 | A * | 2/1990 | Popp | 714/773 |
| 5,140,597 | A * | 8/1992 | Araki | 714/805 |
| 5,233,614 | A * | 8/1993 | Singh | 714/723 |
| 5,278,839 | A * | 1/1994 | Matsumoto et al. | 714/710 |
| 5,325,364 | A * | 6/1994 | Ouchi et al. | 714/5.1 |
| 5,357,473 | A * | 10/1994 | Mizuno et al. | 365/201 |
| 5,671,239 | A * | 9/1997 | Higashitani et al. | 714/805 |
| 5,774,647 | A | 6/1998 | Raynham et al. | |
| 5,883,903 | A * | 3/1999 | Higashitani | 714/710 |
| 5,907,660 | A * | 5/1999 | Inoue et al. | 386/264 |
| 5,946,239 | A * | 8/1999 | Honma | 365/185.21 |
| 5,956,352 | A | 9/1999 | Tatosian et al. | |
| 6,560,725 | B1 | 5/2003 | Longwell et al. | |
| 6,781,898 | B2 * | 8/2004 | Kim et al. | 365/200 |
| 6,813,199 | B2 * | 11/2004 | Hidaka | 365/200 |
| 6,822,913 | B2 * | 11/2004 | Pochmuller | 365/201 |
| 6,914,846 | B2 * | 7/2005 | Harari et al. | 365/230.03 |
| 6,915,476 | B2 * | 7/2005 | Morino et al. | 714/768 |
| 7,181,655 | B2 * | 2/2007 | Ditewig et al. | 714/53 |
| 7,193,876 | B1 * | 3/2007 | Park et al. | 365/49.1 |
| 7,197,670 | B2 * | 3/2007 | Boatright et al. | 714/42 |
| 7,266,664 | B2 * | 9/2007 | Higuchi et al. | 711/173 |
| 7,304,875 | B1 * | 12/2007 | Lien et al. | 365/49.1 |
| 7,376,012 | B2 * | 5/2008 | Kawamoto et al. | 365/185.09 |
| 7,447,950 | B2 * | 11/2008 | Takahashi et al. | 714/702 |
| 7,558,113 | B2 * | 7/2009 | Kawamoto et al. | 365/185.17 |
| 7,631,244 | B2 * | 12/2009 | Suzuki et al. | 714/763 |
| 7,730,384 | B2 * | 6/2010 | Graef et al. | 714/780 |
| 7,830,711 | B2 * | 11/2010 | Kawamoto et al. | 365/185.09 |
| 7,962,809 | B1 * | 6/2011 | Sutardja et al. | 714/718 |
| 2002/0048202 | A1 | 4/2002 | Higuchi | |
| 2003/0084386 | A1 | 5/2003 | Barth, Jr. et al. | |
| 2003/0210899 | A1 * | 11/2003 | Fukuchi | 386/125 |

* cited by examiner

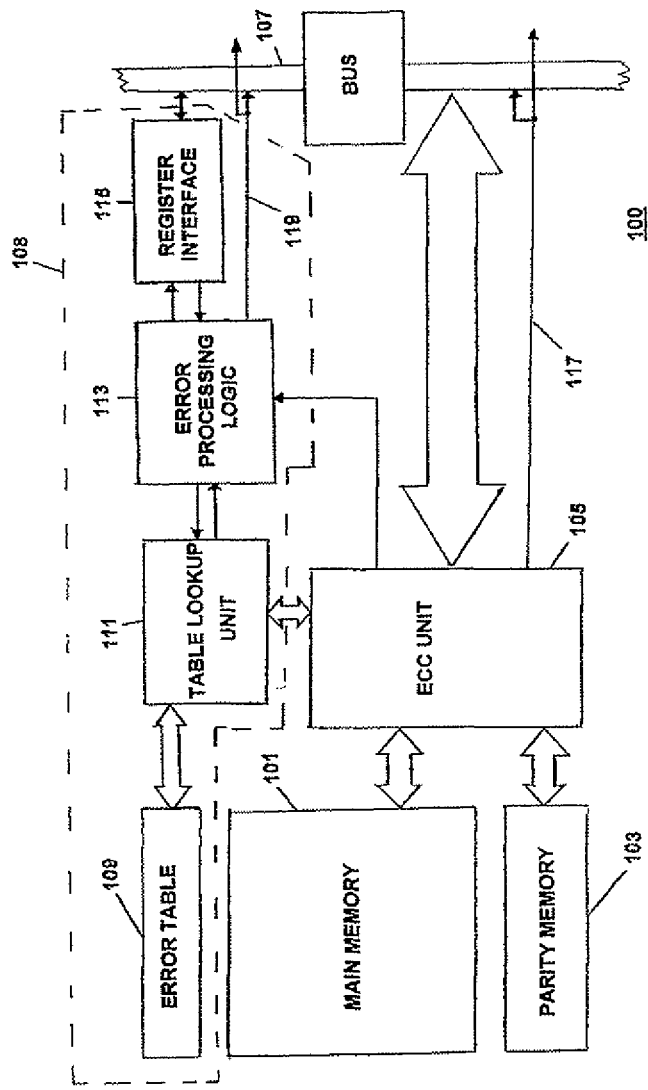

MEMORY SYSTEM WITH ECC-UNIT AND FURTHER PROCESSING ARRANGEMENT

FIELD OF THE INVENTION

The present invention relates to a memory system and a method of operation of the system. In particular, it relates to a memory system including an ECC (error correction code) unit.

BACKGROUND OF THE INVENTION

Memory systems are well known in which a functional unit known as an ECC unit is employed to detect errors in data words which have been stored in an associated memory of the system. An ECC unit operates by reading the stored data, computing a checksum from this data and comparing the computed checksum with stored parity information. An ECC unit is also able to correct detected errors. The detection and correction capability of an ECC unit is usually described by an expression of the form 'detecting N-bit and correcting M-bit', used in relation to the actual word size processed by the ECC unit. N and M are integers indicating the number of errors in a word which are respectively detected and corrected by the ECC unit. The most usual values of N and M are 2 (for detected errors) and 1 (for corrected errors) for data words having a size of either 32 or 64 bits. An ECC unit identified by such a designation in which N is 2 and M is 1 is one that is guaranteed to detect any data word having a maximum of two incorrect bits and having the capability to correct any single bit error in such a word. Instances of errors having more than two incorrect bits may also be detected by such a unit. However, there is no guarantee of such detection, since the multiplicity of changed bits might accidentally match the checksum information. The automatic correction of more than M incorrect bits is usually impossible without risking the integrity of the memory system.

When incorrect data words are corrected by an ECC unit, the errors involved are not visible to any application which subsequently uses the data which included the errors.

SUMMARY OF THE INVENTION

According to the present invention in a first aspect there is provided a memory system as defined in claim 1 of the accompanying claims.

According to the present invention in a second aspect there is provided a method of operation as defined in claim 23 of the accompanying claims.

Further features of the invention are defined in the accompanying dependent claims and are disclosed in the embodiments of the invention described herein.

Embodiments of the present invention will now be described by way of example with reference to the accompanying drawing.

BRIEF DESCRIPTION OF THE ACCOMPANYING DRAWING

The accompanying drawing, FIG. 1, is a block schematic diagram of a memory system embodying the present invention.

DESCRIPTION OF EMBODIMENTS OF THE INVENTION

In connection with embodiments of the present invention to be described, it has been recognised that it would be beneficial to record information and statistical data relating to errors detected and corrected by an ECC unit in a memory system. Such a capability can for example be used to identify a memory device that is ageing significantly or is becoming less reliable. Where such a device is identified, a data application relying on the device may have discretion to provide an indication suggesting a replacement before the device begins to show permanent failure. Furthermore, it has been recognised that it would be beneficial to distinguish newly detected errors from errors already known. Examples of known errors include errors caused by defects arising in the manufacture of a device, herein called 'fabrication errors', and errors detected during an earlier run of the system including the memory.

FIG. 1 is a block schematic diagram of an illustrative memory system 100 embodying the present invention. The memory system 100 may be incorporated in a data processor, e.g. an embedded system in the form of a semiconductor integrated circuit chip. The memory system 100 includes a main memory 101 in which data may be stored and from which data may be accessed and retrieved in use, and a parity memory 103 which holds corresponding parity data. Each of the main memory 101 and the parity memory 103 may be any kind of memory which may be integrated in a semiconductor integrated circuit chip; e.g. a Flash or NVRAM (non-volatile random access memory), or a DRAM (dynamic random access memory). The main memory 101 and the parity memory 103 may be separate functional units or may be provided by separate functions of a single memory device. The memory system 100 further includes an ECC unit 105 coupled to both the main memory 101 and the parity memory 103. A bus 107 within the system 100 (which for example may be a system bus) is employed for transferring related data via the ECC unit 105.

Data to be stored in the main memory 101 is delivered by the bus 107 and is forwarded by the ECC unit 105 to the main memory 101. The ECC unit 105 also calculates corresponding parity information of the data and stores it in the parity memory 103.

Data to be read, e.g. for use in a data processing application (not shown), is requested by the bus 107 from the ECC unit 105. The ECC unit 105 then accesses the main memory 101 and retrieves the requested data from the main memory 101. The ECC unit 105 subsequently calculates a checksum from this data and compares it with corresponding parity information retrieved concurrently from the parity memory 103. When the calculated checksum matches the retrieved parity information, the data read is assumed to be correct and is forwarded to the bus 107. Otherwise, the subsequent processing is dependent on the number of incorrect bits in a given word. Errors shown by mismatches of up to M bits (usually only single bit errors) will be corrected by the ECC unit 105 and then forwarded to the bus 107. Errors shown by mismatches involving more than M bits are assumed in the prior art to be non-recoverable and will result in forwarding of an indication of an error condition. Since corrected data cannot be distinguished from correct data by other parts (not shown) of a system employing the memory system 100, the memory system 100 may optionally employ an additional signal delivered to the bus 107 or to another destination in the system, as indicated in FIG. 1 by a line 117, which provides information indicating that data has been corrected. Usually this information is further processed by software in a running application which employs the data delivered. The further processing may be a time consuming task for an embedded system.

The structure and operation of the components of the system 100 which have been described so far are known. The memory system 100 embodying the invention is newly extended to provide additionally an error further processing arrangement 108, which may comprise several additional functional units, working in parallel with the ECC unit 105. The ECC unit 105 may be modified to co-operate with the error further processing arrangement 108. These additions and modifications may be structured and may operate in a manner described as follows.

The error further processing arrangement 108 includes units added to the memory system 100 to record and identify already known errors. These added units comprise an error table 109 and a table lookup unit 111. The table lookup unit 111 is coupled to the error table 109 and to the ECC unit 105. The error further processing arrangement 108 also includes a register interface 115 for receiving control and configuration information by the error further processing arrangement 108 and for providing registers to allow retrieval of information from the error further processing arrangement 108 via the bus 107. The error further processing arrangement 108 further includes error processing logic 113 coupled to the register interface 115, the table lookup unit 111, the ECC unit 105 and the bus 107. The error processing logic 113 is responsible for receiving information representing indications of error conditions from the various sources to which it is connected and for processing the error indication information according the configuration information provided by the register interface 115.

The error table 109 comprises a memory which records and stores information about known and detected errors in relation to the main memory 101. The information recorded preferably includes the address in the main memory 101 of a failing word together with information to allow the word to be corrected if an error in the word is detected. This information may include the correct data word for this address. This is only one possible implementation selected for use in a preferred embodiment; other contents and/or data organisations in the error table 109 are also possible.

Known errors may include fabrication errors which may have been detected by operation of a testing procedure applied to the main memory 101 and the parity memory 103 prior to both memories being put into operation in the system 100. The content of the error table 109 can store information about such known fabrication errors, and can be extended with information about other errors that have been identified during operational use of the main memory 101. Extending the contents of the error table 109 during operational use may be performed either: (i) under application control by providing related control information through the register interface 115; or (ii) automatically by the ECC unit 105 providing for an error detected by a failing operation a signal to the arrangement 108 which is used to control recording and storage of the error related information in the error table 109. It is further possible to distinguish different classes of errors by having additional tags with each information set stored for a particular error in the error table 109. These tags can then be used to identify different processing procedures to be applied to information relating to an error entry by the error processing logic 113. The error table 109 thereby provides a highly convenient means to distinguish between different classes of known errors and to provide a tailored method for treating the errors in the most suitable way.

The error table 109 thus comprises an additional memory function in the system 100. The additional memory function may be provided in different ways as follows. The additional memory function may be provided by a newly dedicated part of an already existing memory. Existing memories which may be used for this purpose include for example any memory within the system 100, e.g. the main memory 101 or the parity memory 103, or any other memory of a processing device, e.g. a microchip, or a system, of which the system 100 is a part. Alternatively, the additional memory function may be provided by a newly added memory or multiple newly added memories, e.g. by a dedicated memory device not already used within the known components of the system 100 or any device or system of which the system 100 is part. Using a newly added dedicated memory to implement the error table 109 has the benefit that the process of accessing the error table 109 does not have to compete with other processes needing to access the memory. Using a dedicated part of an existing memory can make maximum use of already available resources and can reduce the implementation cost for the error table 109. It is possible that the additional memory function, whether provided by an existing memory or a newly added dedicated memory, may be part of a device structure of which the memory is only one of a number of functions. Furthermore, it is also possible to use any combination of the possible memory types, i.e. an existing memory and a newly added dedicated memory, for the additional memory function. For example, a dedicated newly added memory may be employed for storage of addresses, and a part of an existing memory, e.g. the main memory 101, may be employed to hold other information of the error entries of the error table 109.

The time taken to identify an entry in the error table 109 of a recorded address matching a given address is likely to be one of the most important parameters of the error further processing arrangement 108 embodying the invention. It is therefore preferred to use a dedicated functional memory unit for storage of addresses, since such a unit can be suitably be adapted for fast accessing to facilitate rapid address lookup. The actual implementation of the error table 109 may involve a hierarchy of functional units or hardware blocks, particularly for storage of addresses, to minimise the time to identify an entry in the error table 109.

The error table 109 is accessed by the table lookup unit 111, which can operate separately from accesses of the main memory 101 by the ECC unit 105. Normally, the table lookup unit 111 may be activated when the ECC unit 105 detects an error condition when it retrieves a data word from the main memory 101 and compares the calculated checksum for the data word with the stored parity information according to the known procedure. The ECC unit 105 may deliver an error indication signal to the unit 111 to indicate such an error condition and to give information about the error including an address in the main memory 101 from which the failing word was retrieved. The table lookup unit 111 when activated by the error indication signal then checks whether there is an entry in the error table 109 related to the address of the failing word. This is a 'reactive' use of the table lookup unit 111. Alternatively, there may be a 'proactive' use of the table lookup unit 111, in which the table lookup unit 111 runs concurrently with accesses to the main memory 101 by the ECC unit 105 to identify matching error entries in a requested data word. Implementation of the 'proactive' version has the penalty of a significantly higher hardware cost; therefore the 'reactive' version is preferred.

In all implementations, the table lookup unit 111 is responsible for identifying whether errors related to accesses of the main memory 101 by the ECC unit 105 have previously been recorded in the error table 109. The table lookup unit 111 is further responsible for making of new entries in the error table 109 and storing of all information related to such new entries, either under application control with data supplied by the register interface 115, or upon request by or triggered by the ECC unit 105. New entries in this context are entries related to errors that have not previously been recorded in the error table 109.

The table lookup unit 111 may in a preferred embodiment use a (hardware assisted) binary search algorithm to identify an error entry having a matching address in an ordered list of entries in the error table 109. A binary search algorithm is a well known algorithm using ordered lists which normally operates as follows. A search in each list starts in the middle of the list. The chosen data of the list is compared with the searched data. When the chosen data has a search criterion larger than that of the searched data a lower part of the list is searched. When the chosen data has a search criterion less than that of the searched data an upper part of the list is searched. The search continues through each list until a match is found. Using a binary search for the purpose of identifying an error entry having a matching address has several benefits. The two most significant benefits are: (i) very fast convergence with a minimum number of accesses to the error table 109; and (ii) a guaranteed, maximum number of accesses to the error table 109 to find an entry. Both characteristics are desirable for high performance and a deterministic behaviour of the memory system 100. Alternatively, or in addition, other hardware based implementations, such as a content addressable memory (CAM), are possible to provide the functionality of the table lookup unit 111 and may be employed in the system 100 embodying the invention. However, such other implementations are likely to result in a much higher hardware cost than the preferred use of a binary search algorithm.

It is recognised that in using a binary search algorithm the number of entries in the error table 109 is practically limited for cost and also performance reasons. However, limitation for performance is in any event required to assert a minimum response time in the case of an error detected by the ECC unit 105. Furthermore, these limitations may in any case apply to other, more hardware based approaches.

For performance reasons, it is preferred to use a hardware assisted version of the binary search algorithm for implementation of the table lookup unit 111. Some of the search points for use in the address lookup procedure may conveniently be pre-recorded in internal comparison registers which are evaluated by hardware to speed up the address lookup procedure. Examples of practical implementations are a 16-entry or an 8-entry wide error table having three comparison registers, or a table with 32 entries having 7 comparison registers. Other combinations are also possible, but their suitability is of course dependent on the capability of the hardware available.

In general, the maximum number of permitted entries in the error table 109 is configurable and is dependent on other operational parameters of the system 100, e.g. the size of the main memory 101, the maximum latency permitted to identify a critical error in the system, and others. However, the maximum number of permitted entries in the error table 109 has to be chosen with care, so that acceptable limits are defined for the processing overhead caused by the error further processing arrangement 108 and for adding information relating to new entries to the error table 109.

The error processing logic 113 is responsible for prioritising requests from the ECC unit 105 to the table lookup unit 111, and for providing post-processing of information gathered by the table lookup unit 111 for further consumption. The error processing logic 113 records and stores information calculated from the post-processing into registers provided by the register interface 115. The error processing logic 113 may be configurable based on configuration information provided by the register interface 115. It is also responsible for forwarding error entries generated under application control from the register interface 115 to the table lookup unit 111 for subsequent storage in the error table 109.

The register interface 115 comprises a set of control and data registers and corresponding control logic that may be connected to the bus 107 or to another bus (not shown), e.g. in a device in which the register interface 115 is incorporated. The register interface 115 may be visible to the software of an application using data retrieved from the main memory 101 by the ECC processor 105. The register interface 115 may include registers providing several functions, including but not limited to:

(i) storing control information to influence the processing of errors by the error further processing arrangement 108;

(ii) providing status registers to identify a current operational status of the error further processing arrangement 108;

(iii) recording data gathered by the error further processing arrangement 108; and iv) providing data and control registers to modify or generate known error entries in the error table 109 within the error further processing arrangement 108

With the aid of these registers, the register interface 115 may: permit addition of entries to the error table 109; read or change such entries; or modify the processing of such entries by controlling the error processing logic 113. The register interface 115 provides a portal for access by an application external to the memory system 100 to statistical information held about detected errors and to provide the control information required to configure the recording and retrieval of such information.

When no error is detected by the ECC unit 105 in data retrieved from the main memory 101, no further processing of any error information is needed in the system 100. However, the register interface 115 may include a counter to calculate for statistical purposes the number of successful accesses made by the ECC unit 105 in the main memory 101. Such a counter may receive a signal from the ECC unit 105 to indicate each successful access made.

As noted earlier, the error further processing arrangement 108 comes into operation when the ECC unit 105 detects an error in a data word from the main memory 101. Further processing of this error is dependent on the type of error found as follows.

When the error detected is an error that may be fully corrected, i.e. a single bit error, or in general terms any M-bit error—where M is defined earlier, then the ECC unit 105 will immediately correct the incorrect bit(s) and provide the corrected data to the bus 107. Information about the identified error will also be forwarded by the ECC unit 105 to the table lookup unit 111 and to the error processing logic 113. After providing this information, the ECC unit 105 has fully processed the word containing the error and is available to serve the next request from the bus 107. Upon receiving the error information from the ECC unit 105, the table lookup unit 111 first records this information and waits for the error processing logic 113 to enable it to further process this information. The error processing logic 113 can abort or delay the processing of an M-bit error by the table lookup unit 111 to assert an optimal latency for processing earlier or higher priority tasks. When enabled by the error processing logic 113, the table lookup unit 111 compares the related error information with information stored in the error table 109. When there is a matching entry, this indicates a known error, which is processed accordingly as follows. The related error information is forwarded by the table lookup unit 111 to the error processing logic 113, which performs any associated actions required. These actions may include evaluation for statistical purposes, recording of error information for application use, and/or storing of the information as a new error entry in the error table 109. The actions required by the error processing logic 113 may be actions defined by control information stored in the register interface 115. Subsequently, the error processing logic 113 may further update related information stored in the register interface 115. When reaching a specified, user definable limit, which may be defined within the register interface 115, relating to the number of such errors, the error processing logic 113 may further send an alert signal to an application using the relevant data. Such an alert signal may provide an automatic interruption in the application or may request further action by the application. Provision of the alert signal is indicated in FIG. 1 by a line 119.

When the error newly detected by the ECC processor 105 cannot be fully corrected automatically by the ECC unit 105, e.g. where the error is a two-bit or multiple-bit error, or in general terms is any error larger than M-bit, the ECC unit 105 immediately forwards all information about the newly detected error to the table lookup unit 111 and the error processing logic 113. The error processing logic 113 may request the table lookup unit 111 to abort any currently running processing operation in order to process the newly discovered error immediately. The table lookup unit 111 compares the received error information with the content of the error table 109 to identify a matching entry. When there is no matching entry, then this indicates that the error is an unrecoverable error, and further processing by the ECC unit 105 may be in a manner known in the prior art as described earlier. Additionally, the error processing logic 113 may be activated e.g. to record related error information, e.g. for further use by the application software. When there is a matching entry stored in the error table 109, then the table lookup unit 111 retrieves information from the error table 109 allowing the error to be corrected and delivers the information to the ECC unit 105. Preferably, each entry in the error table 109 contains a complete, correct word and the related parity data, which permits correction of any detectable error found in a failing word, irrespective of the number of incorrect bits. The ECC unit 105 can then use information from the error table 109 to correct the failing word, e.g. by substituting the failing data word with a correct word. The ECC unit 105 may usefully carry out a further ECC check of the data word retrieved from the error table 109, by computing checksum information for the corrected word and comparing it with the related parity information, to confirm the integrity of the data corrected. Dependent on how the system 100 is implemented, the parity information may be stored in the parity memory 102 or alternatively in the error table 109.

Additionally, an error entry in the error table 109 may include one or more related attributes which can be used to further steer the most appropriate processing of a detected error and error type by the ECC unit 105 and the error processing logic 113.

Upon completion of processing of information relating to an error detected by the ECC unit 105, the table lookup unit 111 may be set ready to be re-started when a further error is detected or, where an earlier processing operation was suspended, may continue with the earlier processing operation. Any processing by the table lookup unit 111 is done under the control of the error processing logic 113 and runs concurrently with any further activities of the memory system 100.

The error further processing arrangement 108 in the system 100 embodying the invention may be provided in the form of an extension to an existing ECC unit, or as one or more additional data processing modules. In either case, the arrangement 108 is a newly added arrangement which provides several benefits as follows.

Gathering of statistical information about errors that have been corrected automatically by the ECC unit 105 is a significant benefit for users of the system 100. As noted earlier, errors automatically corrected by an ECC protected memory are basically invisible to other parts of a system using the data retrieved from the memory. Many users of currently available ECC protected memories have a significant concern about not knowing how frequently corrected errors occur and therefore how reliable the protected memory is. Thus the statistical information gathered by the error processing arrangement 108 is very useful to users of the system 100 to give a measure of the reliability of data which has been stored by and retrieved from the main memory 101. Knowledge of the reliability can be extremely important for some specific applications, e.g. in safety critical control applications such as in automobiles and other moving vehicles, such as braking system control and airbag operation control. System developers may further use the statistical information to identify a memory or an area in a memory that is about to fail, and can then select preventive measures to avoid such failures.

In some known systems, additional means is sometimes provided to inform the system about the occurrence of corrected errors. Usually this is done by an exception indicator that interrupts software of a running application to inform the application about the corrected error. The application software is then responsible for recording the corresponding information for further usage. However using software interrupts is an expensive way of obtaining statistical information relating to errors and has the inherent danger of conflicting with other real-time requirements of the application software.

Thus, it is beneficial if gathering of statistical information relating to data errors can be carried out without involvement of application software running for another purpose. The embodiments of the invention allow gathering and provision of the error statistical data to be achieved inexpensively by the error processing arrangement 108 with a low additional processing overhead and with minimal involvement of a data application. Expensive exception based alert procedures known in the prior art may be avoided.

Furthermore, in the embodiments of the invention, provision of information about detected errors required by application software, e.g. for further processing of the information by the application software, may be delayed until there is available time for processing the related information without interfering with other, more important tasks of the application software.

Furthermore, it is possible by use of the embodiments of the invention, to distinguish newly detected errors from known errors, and possibly the type of known errors, e.g. fabrication errors or runtime errors, that have previously been recorded in the error table 109. The error processing logic 113 compiles information about the instances of runtime errors found in operation by the ECC unit 105. The registers located in the register interface 115 can deliver the information collected by the error processing logic 113 to an application whenever this is appropriate or requested.

A very important advantage of the system 100 including the error further processing arrangement 108 is the capability to identify and correct errors in the main memory 101 or in the parity memory 103 that are known errors already recorded in the error table 109. Such a capability allows correction of some errors, e.g. some two or more bit errors, which would be unrecoverable errors in the prior art. Another advantage is the capability of the error further processing arrangement 108 to distinguish between fabrication errors and errors which occur during normal use of the main memory 101. Another important advantage is the capability of the error processing arrangement 108 to compile statistical information relating to errors of a particular type, e.g. errors detected in operation, and to exclude information relating to errors of another particular type, e.g. fabrication errors.

The capability to identify and correct known errors in the main memory 101 or in the parity memory 103 is very important because it preserves the main purpose of the ECC unit 105, i.e. securing the integrity of the data stored in the main memory 101, even in the case of known errors. This capability is beneficial for the manufacturer of a device employing the main memory 101 as well as for the manufacturer of a system in which such a device is integrated. Examples of important application improvements which may be obtained by use of this capability are as follows.

1) Some device manufacturers use an ECC unit to improve product manufacturing yield, which basically involves producing devices which can have single bit errors in the main memory. Usually these errors will be harmless, since the ECC unit will be able to correct them. However, it is a misuse of the ECC functionality to correct and otherwise ignore these errors since the principal intended use of an ECC unit is to assert the integrity of the data content of the main memory. The problem is that there is no differentiation between an existing error which is a fabrication error and an error arising in normal use of the main memory. Where a fabrication error is already held in a particular location of the main memory, any additional error in the same memory location can cause a catastrophic, non-recoverable error of the memory system. As a result, the applicability of such a system is reduced, compared to a system having no fabrication errors. Having the capability to identify and correct known fabrication errors completely overcomes this problem.

2) When new errors occur during normal operation of the main memory 101, they may be repaired without having to replace a device incorporating the main memory 101 or even a complete system incorporating such a device. For example, a motor vehicle may have such a device employed in one of its control units. Repairing any single bit error can be done by attaching a maintenance unit that compares the data content of the main memory 101 with the expected data content and records any differences in the error table 109. Whenever the incorrect data is retrieved from the main memory 101, the error in the data is detected by the ECC unit 105 and the correct data is retrieved from the error table 109 in the manner described earlier. Without such a capability, the device or even the complete system would have to be replaced. Such replacement can be very expensive.

3) Having the capability to record error entries during normal operation of the main memory 101 can also significantly increase the availability of a device or system in which the error system 100 embodying the invention is incorporated. Consider a situation where the error processing logic 113 generates a corresponding special entry in the error table 109 (including the correct word) for a continuously failing single bit error as a preventive means dependent on a certain threshold of erroneous accesses. If then the same memory location shows a second error, the system will still work, in contrast to known systems that will then go out of order. Further, it is possible to provide or re-use certain hardware mechanisms that are verifying write accesses to memories, e.g. a write verify step of a Flash block, or read back verify hardware in a SRAM/DRAM, after performing a write operation. When such a mechanism triggers the creation of an entry in the error table 109, the inability to write the corresponding word will not cause the system to malfunction.

4) Use of an embodiment of the invention can increase the chance of an application surviving an error caused by cosmic or other radiation. For instance, safety critical modules, e.g. in the X-by-wire applications foreseen for use in future vehicle control applications, typically need to pass a test in which the module is irradiated with neutrons whilst in operation and is not allowed to fail. More details about such requirements can be obtained from http://www.automotivedesignline.com/howto/188700110.

These are four examples of improvements in applications that may be obtained by use of the error further processing arrangement 108 of the system 100 embodying the invention, with its many benefits for fabrication yield, system repair and improved availability. Of course there are further possibilities; the examples which have been provided are not an exhaustive list of the improvements which are made possible by use of the error further processing arrangement 108 in the system 100 embodying the invention.

The invention claimed is:

1. A memory system comprising:
a first memory for storing data;
an ECC (error correction code) unit for detecting errors in data retrieved from the first memory and for producing corrected values for some of the data retrieved from the first memory;
an error further processing arrangement to process the errors in data detected by the ECC unit, the error further processing arrangement including:
a second memory for recording data relating to the errors, wherein data relating to an error detected by the ECC unit is to comprise an address in the first memory of data, wherein retrieval of the data generated the error detected by the ECC, together with information enabling the error to be corrected, the information is based upon a corrected value produced by the ECC unit, and the information is recorded in response to the detection of the error by the ECC unit; and
a table lookup unit connected to the ECC unit and the second memory, wherein the ECC unit is to transmit to the table lookup unit addresses of the errors detected by the ECC unit and the table lookup unit is to access the second memory based upon the transmitted addresses.

2. A memory system according to claim 1, wherein the error further processing arrangement includes error processing logic operable to record statistical data relating to the errors detected by the ECC unit.

3. A memory system according to claim 2, wherein the error further processing arrangement includes a register interface operable to configure storage of statistical data by the error processing logic, wherein the register interface is further operable to retrieve and provide statistical data recorded by the error processing logic to a data application outside the memory system.

4. A memory system according to claim 1 wherein the memory system is in the form of a semiconductor integrated circuit chip optionally including one or more other devices or systems.

5. A method performed by a memory system, the memory system comprising a first memory, an ECC (error correction code) unit, an error further processing arrangement, and a table lookup unit, the method comprising:
storing data in the first memory;
detecting by the ECC unit errors in data retrieved from the first memory;
producing by the ECC unit corrected values for some of the data retrieved from the first memory;

processing by the error further processing arrangement the errors in data detected by the ECC unit, the error further processing arrangement including a second memory, the processing including:

recording in the second memory data relating to the errors, wherein data relating to an error detected by the ECC unit comprises an address in the first memory of data, wherein retrieval of the data generated the error detected by the ECC, together with information enabling the error to be corrected, the information is based upon a corrected value produced by the ECC unit, and the information is recorded in response to the detection of the error by the ECC unit;

transmitting by the ECC unit to the table lookup unit addresses of the errors detected by the ECC unit, wherein the table lookup unit is connected to the ECC unit and the second memory; and accessing by the table lookup unit the second memory based upon the transmitted addresses.

6. The method of claim 5, wherein:

the error further processing arrangement includes error processing logic; and the method further comprises the error processing logic recording statistical data relating to the errors detected by the ECC unit.

7. The method of claim 6, wherein:

the error further processing arrangement includes a register interface;

the method further comprises the register interface configuring storage of the statistical data by the error processing logic; and the method further comprises the register interface providing statistical data recorded by the error processing logic to a data application outside the memory system.

8. The method of claim 5 wherein the memory system is in the form of a semiconductor integrated circuit chip optionally including one or more other devices or systems.

9. A non-transitory computer readable medium comprising a set of instructions to manipulate a memory system, the memory system comprising a first memory, an ECC (error correction code) unit, an error further processing arrangement, and a table lookup unit, the set of instructions to:

store data in the first memory;

detect by the ECC unit errors in data retrieved from the first memory;

produce by the ECC unit corrected values for some of the data retrieved from the first memory;

process by the error further processing arrangement the errors in data detected by the ECC unit, the error further processing arrangement including a second memory, wherein the instructions to process include instructions to:

record in the second memory data relating to the errors, wherein data relating to an error detected by the ECC unit comprises an address in the first memory of data, wherein retrieval of the data generated the error detected by the ECC, together with information enabling the error to be corrected, the information is based upon a corrected value produced by the ECC unit, and the information is recorded in response to the detection of the error by the ECC unit;

transmit by the ECC unit to the table lookup unit addresses of the errors detected by the ECC unit, wherein the table lookup unit connected to the ECC unit and the second memory; and access by the table lookup unit the second memory based upon the transmitted addresses.

10. The computer readable medium of claim 9, wherein:

the error further processing arrangement includes error processing logic; and the instructions comprise instructions to record by the error processing logic statistical data relating to the errors detected by the ECC unit.

11. The computer readable medium of claim 10, wherein:

the error further processing arrangement includes a register interface;

the instructions comprise instructions to configure, by the register interface, storage of the statistical data by the error processing logic; and the instructions comprise instructions to provide by the register interface statistical data recorded by the error processing logic to a data application outside the memory system.

12. The computer readable medium of claim 9 wherein the memory system is in the form of a semiconductor integrated circuit chip optionally including one or more other devices or systems.

* * * * *